(12) United States Patent
Bergbauer et al.

(10) Patent No.: US 11,114,584 B2
(45) Date of Patent: Sep. 7, 2021

(54) OPTOELECTRONIC COMPONENT

(71) Applicant: OSRAM Opto Semiconductors GmbH, Regensburg (DE)

(72) Inventors: Werner Bergbauer, Windberg (DE); Joachim Hertkorn, Wörth an der Donau (DE)

(73) Assignee: OSRAM OLED GmbH, Regensburg (DE)

( * ) Notice: Subject to any disclaimer, the term of this patent is extended or adjusted under 35 U.S.C. 154(b) by 248 days.

(21) Appl. No.: 16/329,860

(22) PCT Filed: Aug. 28, 2017

(86) PCT No.: PCT/EP2017/071550
§ 371 (c)(1),
(2) Date: Mar. 1, 2019

(87) PCT Pub. No.: WO2018/041778
PCT Pub. Date: Mar. 8, 2018

(65) Prior Publication Data
US 2019/0237617 A1    Aug. 1, 2019

(30) Foreign Application Priority Data
Sep. 2, 2016   (DE) .................... 10 2016 116 425.9

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0025* (2013.01); *H01L 33/0075* (2013.01); *H01L 33/32* (2013.01); *H01S 5/3407* (2013.01)

(58) Field of Classification Search
CPC ................................................ H01L 33/0025
See application file for complete search history.

(56) References Cited

U.S. PATENT DOCUMENTS 6,586,762 B2   7/2003   Kozaki
2002/0053676 A1   5/2002   Kozaki
(Continued)

FOREIGN PATENT DOCUMENTS

CN     1790760 A    6/2006
CN     103872198 A  6/2014
(Continued)

OTHER PUBLICATIONS

Korean Office Action dated Mar. 25, 2020, of counterpart Korean Application No. 10-2019-7007953, along with an English translation.

(Continued)

*Primary Examiner* — Mounir S Amer
(74) *Attorney, Agent, or Firm* — DLA Piper LLP (US)

(57) ABSTRACT

An optoelectronic component includes an active layer having a multiple quantum well structure, wherein the multiple quantum well structure includes quantum well layers, including $Al_{x1}In_{y1}Ga_{1-x1-y1}N$ with $0 \leq x1 < 0.03$, $0 \leq y1 \leq 0.1$ and $x1+y1 \leq 1$, and barrier layers including $Al_{x2}In_{y2}Ga_{1-x2-y2}N$ with $0 \leq x2 \leq 1$, $0 \leq y2 \leq 0.02$ and $x2+y2 \leq 1$, wherein the barrier layers have a spatially varying aluminium content x2, a maximum value of the aluminium content in the barrier layers is $x2,max \geq 0.05$, and a minimum value of the aluminium content in the barrier layers is $x2,min < 0.05$.

13 Claims, 2 Drawing Sheets

(51) Int. Cl.
   *H01L 33/32*   (2010.01)
   *H01S 5/34*    (2006.01)

(56) References Cited

U.S. PATENT DOCUMENTS

| | | | |
|---|---|---|---|
| 2003/0209714 A1* | 11/2003 | Taskar | H01L 33/46 257/79 |
| 2004/0256611 A1 | 12/2004 | Kim et al. | |
| 2005/0082548 A1* | 4/2005 | Sakong | H01S 5/02 257/79 |
| 2008/0217632 A1 | 9/2008 | Tomiya et al. | |
| 2010/0187497 A1* | 7/2010 | Nago | H01L 33/32 257/13 |
| 2011/0291127 A1 | 12/2011 | Han et al. | |
| 2012/0273758 A1 | 11/2012 | Komada | |
| 2014/0054542 A1 | 2/2014 | Han et al. | |
| 2014/0138617 A1 | 5/2014 | Lai et al. | |
| 2015/0108426 A1* | 4/2015 | Hertkorn | H01L 33/32 257/13 |
| 2015/0144874 A1 | 5/2015 | Park et al. | |
| 2016/0293796 A1 | 10/2016 | Liu et al. | |

FOREIGN PATENT DOCUMENTS

| | | |
|---|---|---|
| CN | 104396031 A | 3/2015 |
| CN | 104638073 A | 5/2015 |
| CN | 105161586 A | 12/2015 |
| CN | 105374912 A | 3/2016 |
| CN | 106992233 A | 7/2017 |
| CN | 110970533 A | 4/2020 |
| DE | 10 2012 104 671 A1 | 12/2013 |
| DE | 10 2013 200 507 A1 | 7/2014 |
| JP | 2002-223042 A | 8/2002 |
| JP | 2004-356256 A | 12/2004 |
| JP | 2005-12216 A | 1/2005 |
| JP | 2006-210692 A | 8/2006 |
| JP | 2010-92898 A | 4/2010 |
| JP | 2012-234891 A | 11/2012 |
| JP | 2014-42023 A | 3/2014 |
| KR | 10-2013-0096991 A | 9/2013 |
| KR | 10-2015-0061252 A | 6/2015 |
| WO | 2005/020396 A1 | 3/2005 |

OTHER PUBLICATIONS

Notice of Allowance dated Nov. 10, 2020, of counterpart Korean Application No. 10-2019-7007953, along with an English translation.

Notice of Reasons for Refusal dated May 19, 2020, of counterpart Japanese Application No. 2019-512200, along with an English translation.

The First Office Action dated Oct. 10, 2020, of counterpart Chinese Application No. 201780054045.9, along with an English translation.

Decision of Refusal dated May 24, 2021, of counterpart Japanese Application No. 2019-512200, along with an English translation.

* cited by examiner

OPTOELECTRONIC COMPONENT

TECHNICAL FIELD

This disclosure relates to an optoelectronic component emitting, in particular, violet or ultraviolet radiation, comprising an active layer with a quantum well structure comprising nitride compound semiconductor materials, in particular AlInGaN.

BACKGROUND

Quantum well structures made of nitride compound semiconductors, in particular AlInGaN, are frequently used as active layers in LEDs or laser diodes, which usually emit in the blue spectral range. Depending on the composition of the semiconductor material, emission in the violet or ultraviolet spectral range is also possible. It is necessary to use barrier layers in the quantum well structure with a comparatively large electronic band gap to achieve an efficient emission in the ultraviolet spectral range. This can be achieved in the AlInGaN material system by increasing the aluminium content. However, the lattice constant of nitride compound semiconductor materials decreases with increasing aluminium content. This can lead to comparatively high tensile stresses when growing layers with a high aluminium content. This results in the risk of defects, especially cracks, forming in the semiconductor layers.

It could therefore be helpful to provide an optoelectronic component with an active layer particularly suitable for emitting radiation in the ultraviolet spectral range and characterized by a reduced risk of defect formation.

SUMMARY

We provide an optoelectronic component including an active layer having a multiple quantum well structure, wherein the multiple quantum well structure includes quantum well layers, including $Al_{x1}In_{y1}Ga_{1-x1-y1}N$ with $0 \leq x1 < 0.03$, $0 \leq y1 \leq 0.1$ and $x1+y1 \leq 1$, and barrier layers including $Al_{x2}In_{y2}Ga_{1-x2-y2}N$ with $0 \leq x2 \leq 1$, $0 \leq y2 \leq 0.02$ and $x2+y2 \leq 1$, wherein the barrier layers have a spatially varying aluminium content x2, a maximum value of the aluminium content in the barrier layers is $x2,max \geq 0.05$, and a minimum value of the aluminium content in the barrier layers is $x2,min < 0.05$.

We also provide an optoelectronic component including an active layer having a multiple quantum well structure, wherein the multiple quantum well structure includes quantum well layers, including $Al_{x1}In_{y1}Ga_{1-x1-y1}N$ with $0 \leq x1 < 0.03$, $0 \leq y1 \leq 0.1$ and $x1+y1 \leq 1$, and barrier layers including $Al_{x2}In_{y2}Ga_{1-x2-y2}N$ with $0 \leq x2 \leq 1$, $0 \leq y2 \leq 0.02$ and $x2+y2 \leq 1$, the barrier layers have a spatially varying aluminium content x2, a maximum value of the aluminium content in the barrier layers is $x2,max \geq 0.05$, a minimum value of the aluminium content in the barrier layers is $x2,min < 0.05$, the multiple quantum well structure is arranged between an n-type semiconductor region and a p-type semiconductor region, an intermediate layer is arranged between a barrier layer and a subsequent quantum well layer in a direction pointing from the n-type semiconductor region to the p-type semiconductor region, and the intermediate layer comprises $Al_{x3}In_{y3}Ga_{1-x3-y3}N$ with $0 \leq x3 < 0.03$, $0 \leq y3 \leq 0.02$ and $x3+y3 \leq 1$.

Figure 1:
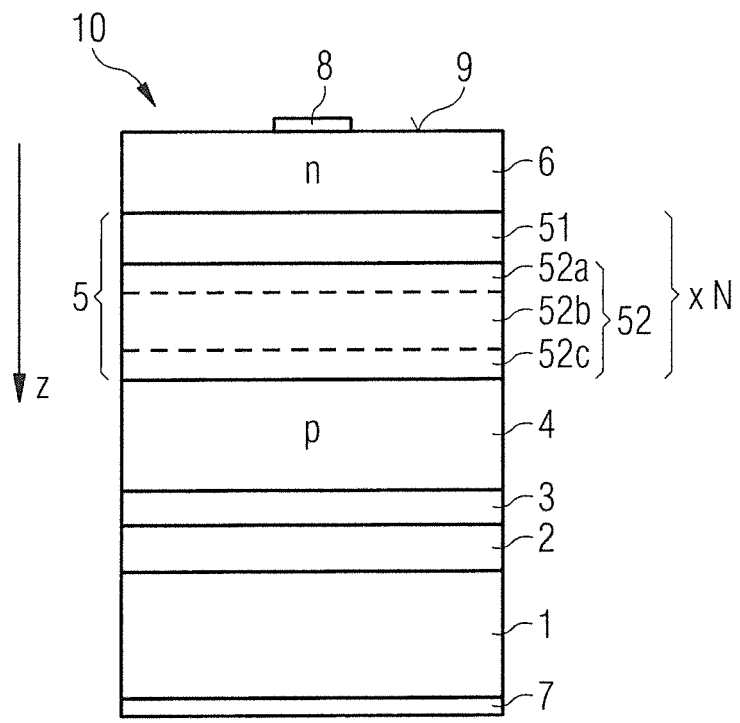
FIG. 1 shows a schematic representation of a cross-section through an optoelectronic component according to a first example.

REFERENCES 1 carrier substrate
2 connection layer
3 mirror layer
4 p-type semiconductor region
5 multiple quantum well structure
6 n-type semiconductor region
7 first contact layer
8 second contact layer
9 radiation exit surface
10 optoelectronic component
51 quantum well layer
52 barrier layer
52a partial layer of the barrier layer
52b partial layer of the barrier layer
52c partial layer of the barrier layer
53 intermediate layer

DETAILED DESCRIPTION

Our optoelectronic component may have an active layer comprising a multiple quantum well structure, wherein the multiple quantum well structure comprises quantum well layers and barrier layers. The barrier layers have a larger electronic band gap than the quantum well layers, at least in some regions. The quantum well layers preferably comprise $Al_{x1}In_{y1}Ga_{1-x1-y1}N$ with $0 \leq x1 < 0.03$, $0 \leq y1 \leq 0.1$ and $x1+y1 \leq 1$. The aluminium content in the quantum well layers is preferably x1=0. Furthermore, the indium content in the quantum well layers is preferably y1>0. The quantum well layers preferably comprise InGaN, in particular $In_{y1}Ga_{1-y1}N$ with $0 < y1 \leq 0.1$.

The barrier layers preferably comprise $Al_{x2}In_{y2}Ga_{1-x2-y2}N$ with $0 \leq x2 \leq 1$, $0 \leq y2 \leq 0.02$ and $x2+y2 \leq 1$, with the aluminium content x2 varying spatially in the barrier layers. The aluminium content varies in the direction perpendicular to the main planes of the barrier layers or, in other words, in the growth direction of the barrier layers. For the maximum value of the aluminium content x2 in the barrier layers, $x2,max \geq 0.05$ preferably holds true. Furthermore, for the minimum value of the aluminium content x2,min in the barrier layers, $x2,min < 0.05$ preferably holds true.

By the fact that the aluminium content x2 in the barrier layers of the quantum well structure is not constant, but varies spatially and has a maximum value $x2,max \geq 0.05$ and a minimum value $x2 < 0.05$, a large electronic band gap can be achieved, wherein, however, the aluminium content averaged over the layer thickness of the barrier layer is advantageously lower than the maximum value $x2,max \geq 0.05$ of the aluminium content. This reduces tensile stresses in the barrier layers and thus prevents the risk of defects and/or cracks forming in the barrier layers.

The barrier layers have the maximum value x2,max of the aluminium content advantageously at at least one interface to an adjacent quantum well layer. This has the advantage that the barrier layers have a large electronic band gap at the interface to the adjacent quantum well layer. In this way, a large barrier height is achieved at the interface to the quantum well layer.

Preferably, the maximum value x2,max of the aluminium content is x2,max≥0.1, particularly preferred x2,max≥0.2. Such a high aluminium content is advantageous for a quantum well structure intended for emission of radiation in the ultraviolet spectral range.

In particular, the aluminium content in the barrier layers may initially decrease in the form of one or more steps or continuously to the minimum value x2,min from an interface with the layer preceding it. Subsequently, the aluminium content can increase again from the minimum in the form of one or more steps or continuously.

The barrier layers may exhibit the minimum value of the aluminium content x2,min in at least one region having a distance of at least 1 nm from an adjacent quantum well layer.

The minimum value of the aluminium content in the barrier layers is preferably x2,min≤0.02, particularly preferred x2,min=0. In particular, the barrier layers may contain GaN in the range of the minimum value of the aluminium content.

Preferably, the active layer is arranged between an n-type semiconductor region and a p-type semiconductor region, an intermediate layer being arranged between a barrier layer and the subsequent quantum well layer in a direction pointing from the n-type semiconductor region to the p-type semiconductor region. The direction from the n-type semiconductor region to the p-type semiconductor region typically corresponds to the growth direction of the semiconductor layer sequence. Thus, an intermediate layer is arranged at the interfaces where a quantum well layer follows a barrier layer in the growth direction. The intermediate layer preferably comprises $Al_{x3}In_{y3}Ga_{1-x3-y3}N$ with $0 \leq x3 < 0.03$, $0 \leq y3 \leq 0.02$ and $x3+y3 \leq 1$. The thickness of the intermediate layer is advantageously less than 1.5 nm, preferably less than 1 nm. The intermediate layer has a low aluminium content $x3 \leq 0.03$, preferably $x3 \leq 0.01$ and especially preferred $x3=0$ compared to the subsequent barrier layer. Furthermore, the indium content $y3 \leq 0.02$ in the intermediate layer is only very low or preferably $y3=0$. In particular, the intermediate layer can be a GaN layer.

Inserting the intermediate layer between a barrier layer and the subsequent quantum well layer has the particular advantage that direct growth of the quantum well layer on the barrier layer with the high aluminium content is avoided. We found it to be advantageous not to grow the quantum well layers, which in particular have an indium content, directly on the barrier layers with a high aluminium content since unfavorable reactions could occur between indium and aluminium.

The barrier layers in the direction pointing from the n-type semiconductor region to the p-type semiconductor region may each adjoin directly to a preceding quantum well layer. Thus, no intermediate layer is arranged at these interfaces. Rather, it is advantageous if an abrupt transition from the material of the quantum well layer to the material of the barrier layer takes place at these interfaces to avoid an increased probability of presence of holes in the barrier layers.

The quantum well structure may be a multiple quantum well structure having several periods of three layers each. The three layers are the barrier layer, the intermediate layer and the quantum well layer. The number of periods is advantageously 3 to 15, preferably 4 to 8.

The thickness of the barrier layers in the multiple quantum well structure is particularly 3 nm to 8 nm, preferably 3 nm to 5 nm. The quantum well layers preferably have a thickness of 2 nm to 4 nm.

The optoelectronic component is preferably a UV emitting optoelectronic component. In particular, the optoelectronic component may be suitable for emitting UV radiation with a central wavelength of less than 420 nm. The central wavelength is particularly preferably 365 nm to 400 nm. The optoelectronic component emitting in this spectral range can be used in particular for curing lacquers.

Our components will be explained in more detail in the following examples in connection with the drawings.

Identical or equivalent components are each provided with the same reference signs in the figures. The represented components as well as the proportions of the components among each other are not to be regarded as true to scale.

The optoelectronic component 10 according to an example shown in FIG. 1 is an LED chip having a p-type semiconductor region 4, an n-type semiconductor region 6 and an active layer suitable for emitting radiation and arranged between the p-type semiconductor region 4 and the n-type semiconductor region 6, which active layer is a multiple quantum well structure 5. The LED chip 10 is preferably an LED chip emitting in the ultraviolet spectral range. The multiple quantum well structure 5 of the LED chip 10 is preferably suitable for emitting radiation with a central wavelength of less than 420 nm, preferably 365 nm to 400 nm.

The LED chip 10 according to the example is a so-called thin-film semiconductor chip, from which a growth substrate originally used for epitaxial growth of the semiconductor layer sequence 4, 5, 6 has been removed and instead the semiconductor layer sequence 4, 5, 6 has been bonded to a carrier substrate 1 different from the growth substrate by a bonding layer 2, in particular a solder layer.

In such a thin-film LED chip, the p-type semiconductor region 4 usually faces the carrier substrate 1. A mirror layer 3 is advantageously arranged between the p-type semiconductor region 4 and the carrier substrate 1, which advantageously deflects radiation emitted in the direction of the carrier substrate 1 towards a radiation exit surface 9 of the optoelectronic component 10. The mirror layer 3, for example, is a metal layer containing Ag, Al or Au.

For the electrical contacting of the optoelectronic component 10, for example, a first contact layer 7 can be provided on a rear side of the carrier substrate 1 and a second contact layer 8 on a partial area of the radiation exit surface 9.

The p-type semiconductor region 4 and the n-type semiconductor region 6 can each be composed of several sublayers and do not necessarily have to consist exclusively of p-doped layers or n-doped layers, but can, for example, also have one or more nominally undoped layers.

As an alternative to the example shown, the optoelectronic component 10 could also have an opposite polarity, i.e., the n-type semiconductor region 6 could face a substrate and the p-type semiconductor region 4 a radiation exit surface 9 of the optoelectronic semiconductor chip (not shown). This is usually true with optoelectronic semiconductor chips in which the growth substrate used for epitaxial growth of the semiconductor layers is not detached, as the n-type semiconductor region is usually first grown on the growth substrate.

The semiconductor layer sequence 4, 5, 6 of the optoelectronic component 10 is based on a nitride compound semiconductor. "Based on a nitride compound semiconductor" means that the semiconductor layer sequence or at least one layer thereof comprises a III-nitride compound semiconductor material, preferably $Al_xIn_yGa_{1-x-y}N$, wherein $0 \leq x \leq 1$, $0 \leq y \leq 1$ and $x+y \leq 1$. This material does not necessarily have to have a mathematically exact composition according to the above formula. Rather, it may contain one or more dopants and additional components that do not substantially alter the characteristic physical properties of the AlxInyGa1-x-yN material. For simplicity's sake, however, the above formula contains only the essential components of the crystal lattice (In, Al, Ga, N), even if these may be partially replaced by small amounts of other substances.

The electronic band gaps of nitride compound semiconductor materials can be adjusted in particular by varying the aluminium content and/or the indium content in the semiconductor material. With these types of semiconductors, the band gap increases with increasing aluminium content x and decreases with increasing indium content y.

The active layer of the optoelectronic semiconductor chip 10 intended for the emission of radiation is designed as a multiple quantum well structure 5. The multiple quantum well structure 5 has a plurality of alternately arranged quantum well layers 51 and barrier layers 52. The quantum well layers 51 have a bandgap $E_{QW}$ and the barrier layers 52 have at least in some areas a bandgap $E_B > E_{QW}$. The multiple quantum well structure 5 is in particular a periodic layer sequence having a number of N periods, wherein the number of periods N, for example, is 3 to 15, preferably 4 to 8.

The quantum well layers 51 have a thickness of 2 nm to 4 nm, for example. The thickness of the barrier layers 52 is, for example, 3 nm to 8 nm, preferably 3 nm to 5 nm.

The quantum well layers 51 in the example of the multiple quantum well structure 5 contain $Al_{x1}In_{y1}Ga_{1-x1-y1}N$ with $0 \leq x1 < 0.03$, $0 \leq y1 \leq 0.1$ and $x1+y1 \leq 1$. Due to the low aluminium content $x1 < 0.03$, preferably $x1=0$, a large difference in the electronic band gap can be achieved compared to the barrier layers 52 having a higher aluminium content. In other words, comparatively deep quantum wells can be produced. Furthermore, the indium content $y1 \leq 0.1$ in the quantum well layers 51 is also low since the electronic band gap would decrease with increasing indium content. Since the optoelectronic component is intended in particular for the emission of very short-wave radiation, especially in the UV range, a low indium content in the range between $y1=0$ and $y1=0.1$ is advantageous.

The barrier layers 52 in the example of the optoelectronic component comprise $Al_{x2}In_{y2}Ga_{1-x2-y2}N$ with $0.05 \leq x2 \leq 1$, $0 \leq y2 \leq 0.02$ and $x2+y2 \leq 1$. To achieve a large electronic band gap, the barrier layers 52 have only a very low indium content $y2 \leq 0.02$ or preferably no indium so that $y2=0$. The material of the barrier layers 52 is therefore preferably $Al_{x2}Ga_{1-x2}N$ with $0 \leq x2 \leq 1$. Preferably, the aluminium content of the barrier layers 52 has a maximum value $x2,max \geq 0.05$ at least at the interfaces where a barrier layer 52 follows the quantum well layer 51 in a direction from the n-type semiconductor region 6 to the p-type semiconductor region 4. Particularly preferred is $x2,max \geq 0.1$ or even $x2,max \geq 0.2$. For example, the barrier layers 52 may have $Al_{0.15}Ga_{0.85}N$ at the interfaces to the adjacent quantum well layers 51.

The aluminium content x2 in the barrier layers 52 is not constant, but shows a spatial variation in the z-direction, which is perpendicular to the layer planes of the n-type semiconductor region 6 to the p-type semiconductor region. In particular, it is possible that the barrier layers 52 are composed of several sublayers 52a, 52b, 52c with different aluminum contents x2.

Figure 2:
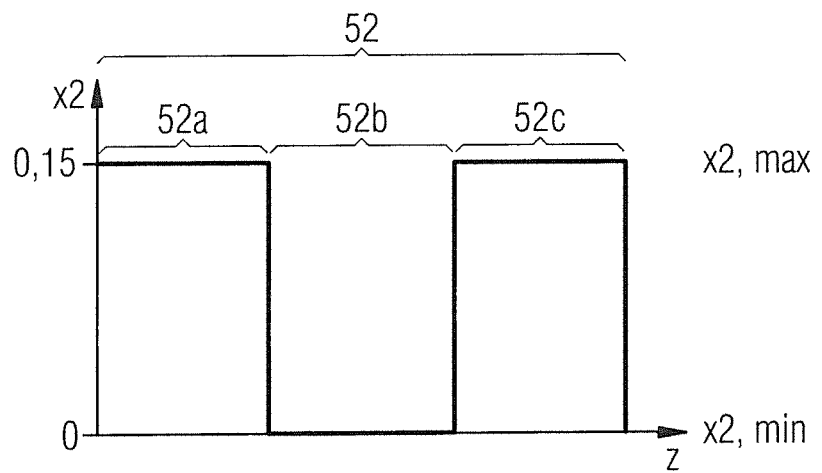
FIG. 2 shows a schematic representation of the course of the aluminium content in the barrier layer in an example.
Figure 3:
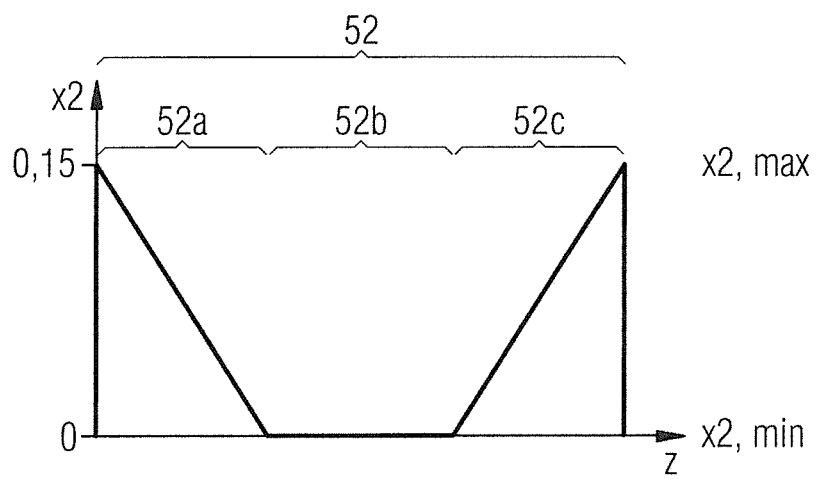
FIG. 3 shows a schematic representation of the aluminium content in the barrier layer in a further example.

The variation of the aluminium content in the z-direction of the barrier layer 52 is shown for two examples in FIGS. 2 and 3.

In the example shown in FIG. 2, the barrier layer 52 has two outer sublayers 52a, 52c and a middle sublayer 52b in between. The middle sublayer 52b has a lower aluminium content x2 than the outer sublayers 52a, 52c. Preferably, the aluminium content x2 in the outer sublayers 52a, 52c has a maximum value $x2,max \geq 0.05$, for example, $x2,max = 0.15$. In the middle sublayer 52c, the aluminium content has a minimum value of $x2,min < 0.05$, preferably $x2,min < 0.02$, for example, $x2,min = 0$. In the example shown, the outer sublayers 52a, 52c are each $Al_{0.15}Ga_{0.85}N$ layers, and the middle sublayer 52b is a GaN layer. The outer sublayers 52a, 52c, for example, can have a thickness of 1 nm to 2 nm, and the middle sublayer 52b can have a thickness 2 nm to 3 nm. The total thickness of the barrier layer 52, composed of the three sublayers, can be about 3 nm to 8 nm.

In this example, the step-shaped course of the aluminum content x2 results in an advantageously high electronic band gap at the interfaces to the adjacent quantum well layers 51 due to the high aluminum content of the outer sublayers 52a, 52c of the barrier layers 52. This is advantageous to enable emission of very short-wave radiation in the UV range in particular. On the other hand, the lower aluminum content in the middle sublayer 52c reduces the mechanical stresses in the barrier layer 52, thus reducing the risk of crystal defects such as dislocations or cracks forming in the barrier layer 52.

The first sublayer 52a, which was first grown during the epitaxial growth of the barrier layer 52, has a tensile stress during growth on a semiconductor layer with a larger lattice constant due to its comparatively small lattice constant, which is caused by the high aluminium content x2,max. This tensile stress would lead to defects with increasing layer thickness. Such defect formation can be effectively reduced by inserting the middle sublayer 52b after the first sublayer has reached a thickness of not more than 2 nm or preferably not more than 1 nm.

FIG. 3 shows another example of the course of the aluminum content x2 in the barrier layer 52. The barrier layer 52 has a first outer sublayer 52a, a middle sublayer 52b and a second outer sublayer 52c. In contrast to the previous example, the outer sublayers 52a and 52c do not have a constant aluminium content but a gradient of the aluminium content. For example, the aluminium content in the first outer sublayer 52a can decrease from the maximum value x2,max to the minimum value x2,min and increase again in the second outer sublayer from the minimum value x2,min to the maximum value x2,max. FIG. 3 shows an example of a linear gradient of the aluminium content x2 in each of the outer sublayers.

Alternatively, it is also possible that the aluminium content decreases or increases in a non-linear manner. In particular, it is possible that the aluminium content decreases or increases in steps.

It is also possible that the middle sublayer 52b is omitted so that the barrier layer 52 has only two sublayers 52a, 52b. For example, the aluminium content in the first sublayer 52a can decrease stepwise or continuously to a minimum value of x2,min and then increase again stepwise or continuously in a second sublayer 52c directly adjacent to it. The course of the aluminium content does not necessarily have to be symmetrical with respect to the center of the barrier layer 52, rather the barrier layer 52 may also have an asymmetrical course of the aluminium content x2.

With regard to the course of the aluminium content in the barrier layer 52, various designs are thus possible, the aluminium content preferably having a minimum value $x2,min$ in the interior of the barrier layer 52 and a maximum value $x2,max$ at the interfaces to the adjacent semiconductor layers.

Figure 4:
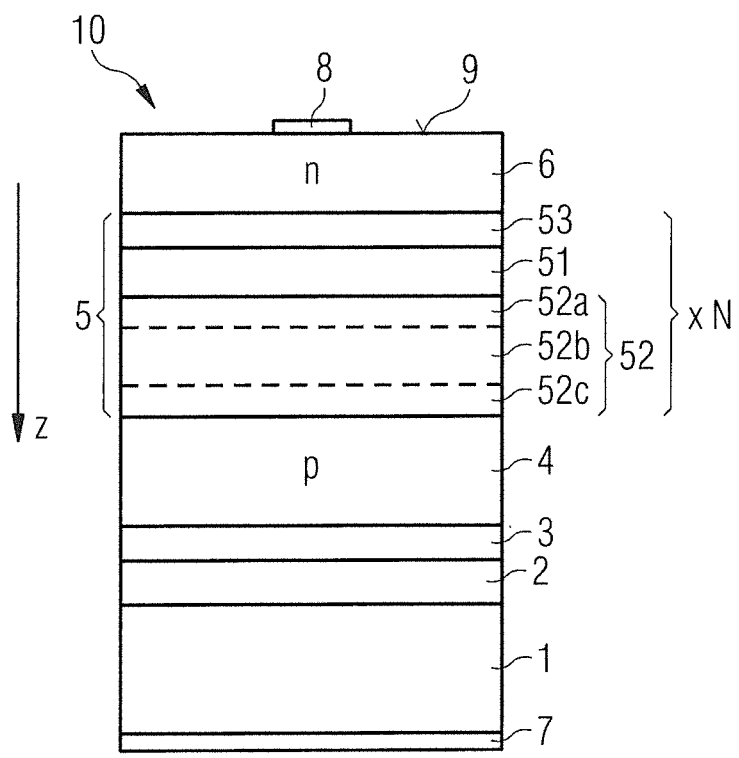
FIG. 4 shows a schematic representation of a cross-section through an optoelectronic component according to another example.

FIG. 4 shows another example of the optoelectronic component 10. This example differs from the example in FIG. 1 in that in the z-direction pointing from the n-type semiconductor region 6 to the p-type semiconductor region 4, i.e., in the growth direction of the semiconductor layer sequence, an intermediate layer 53 is arranged before each quantum well layer 51. In this configuration, the periods of the multiple quantum well structure 5 thus each have three layers, namely the intermediate layer 53, the quantum well layer 51 following the intermediate layer 53 and the barrier layer 52 following the quantum well layer 51. As in the previous example, the number of periods N is advantageously 3 to 15, preferably 4 to 8.

The intermediate layer 53 is a comparatively thin layer with a thickness of preferably not more than 1.5 nm, particularly preferably not more than 1 nm. The intermediate layer contains $Al_{x3}In_{y3}Ga_{1-x3-y3}N$ with $0 \leq x3 \leq 0.03$, $0 \leq y3 \leq 0.02$ and $x3+y3 \leq 1$. Preferably the aluminium content is $x3=0$ and/or the indium content is $y3=0$. The thin intermediate layer with the comparatively low or preferably no aluminium content has the advantage that there is no undesired reaction between indium and aluminium or their precursor materials in the gas phase during the growth of the quantum well layer 53, which typically has an indium content.

At the interfaces of the multiple quantum well structure 5, where a barrier layer 52 follows a quantum well layer 51 in the z-direction from the n-type semiconductor region 6 to the p-type semiconductor region 4, preferably no intermediate layer is arranged. In other words, the quantum well layers 51 in the growth direction are directly preceded by an intermediate layer 53, but the quantum well layers 51 are not directly followed by an intermediate layer. At the interfaces where a barrier layer 52 follows a quantum well layer 51 in the growth direction, it is advantageous for the barrier layer 52 to be directly adjacent to the quantum well layer 53. The electronic band structure is influenced in this way such that the probability of holes in the barrier layers 52 being present is reduced. In this way, the efficiency of radiation generation in the multiple quantum well structure can be improved.

With regard to further advantageous designs, in particular the configurations of the barrier layers 52 and the associated advantages, the example in FIG. 4 otherwise corresponds to the previously described examples.

Our components are not limited by the description based on the examples. Rather, this disclosure includes each new feature as well as each combination of features, which in particular includes each combination of features in the appended claims, even if the feature or combination itself is not explicitly stated in the claims or examples.

This application claims priority of DE 10 2016 116 425.9, the subject matter of which is incorporated herein by reference.

The invention claimed is:

1. An optoelectronic component comprising an active layer having a multiple quantum well structure, wherein the multiple quantum well structure comprises quantum well layers, comprising $Al_{x1}In_{y1}Ga_{1-x1-y1}N$ with $0 \leq x1 < 0.03$, $0 \leq y1 \leq 0.1$ and $x1+y1 \leq 1$, and barrier layers comprising $Al_{x2}In_{y2}Ga_{1-x2-y2}N$ with $0 \leq x2 \leq 1$, $0 \leq y2 \leq 0.02$ and $x2+y2 \leq 1$, the barrier layers have a spatially varying aluminium content $x2$, a maximum value of the aluminium content in the barrier layers is $x2,max \geq 0.05$, a minimum value of the aluminium content in the barrier layers is $x2,min < 0.05$, the multiple quantum well structure is arranged between an n-type semiconductor region and a p-type semiconductor region, an intermediate layer is arranged between a barrier layer and a subsequent quantum well layer in a direction pointing from the n-type semiconductor region to the p-type semiconductor region, the intermediate layer is directly adjacent to the subsequent quantum well layer, and the intermediate layer comprises $Al_{x3}In_{y3}Ga_{1-x3-y3}N$ with $0 \leq x3 < 0.03$, $0 \leq y3 \leq 0.02$ and $x3+y3 \leq 1$.

2. The optoelectronic component according to claim 1, wherein the intermediate layer is less than 1.5 nm thick.

3. The optoelectronic component according to claim 1, wherein the barrier layers have the maximum value $x2,max$ of the aluminium content at at least one interface to an adjacent quantum well layer.

4. The optoelectronic component according to claim 1, wherein the maximum value of the aluminium content in the barrier layers is $x2,max \geq 0.1$.

5. The optoelectronic component according to claim 1, wherein the maximum value of the aluminium content in the barrier layers is $x2,max \geq 0.2$.

6. The optoelectronic component according to claim 1, wherein the aluminium content in the barrier layers decreases from an interface with the layer preceding it in the form of one or more steps or continuously to the minimum value $x2,min$, and increases from the minimum value in the form of one or more steps or continuously again.

7. The optoelectronic component according to claim 1, wherein the barrier layers have the minimum value $x2,min$ of the aluminium content in a region having a distance of at least 1 nm from an adjacent quantum well layer.

8. The optoelectronic component according to claim 1, wherein the minimum value of the aluminium content in the barrier layers is $x2,min < 0.02$.

9. The optoelectronic component according to claim 1, wherein the minimum value of the aluminium content in the barrier layers is $x2,min = 0$.

10. The optoelectronic component according to claim 1, wherein the intermediate layer comprises GaN.

11. The optoelectronic component according to claim 1, wherein the barrier layers each directly adjoin a preceding quantum well layer in a direction pointing from the n-type semiconductor region to the p-type semiconductor region.

12. The optoelectronic component according to claim 1, wherein the optoelectronic component is adapted to emit UV radiation having a central wavelength of less than 420 nm.

13. The optoelectronic component according to claim 12, wherein the central wavelength is 365 nm to 400 nm.

* * * * *